US007858010B2

United States Patent
Cho et al.

(10) Patent No.: US 7,858,010 B2
(45) Date of Patent: Dec. 28, 2010

(54) SOFT TEMPLATE WITH ALIGNMENT MARK

(75) Inventors: Eun-hyoung Cho, Seoul (KR);
 Sung-hoon Choa, Seoul (KR);
 Jin-seung Sohn, Seoul (KR); Du-hyun Lee, Suwon-si (KR); Hae-sung Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 78 days.

(21) Appl. No.: 11/945,400

(22) Filed: Nov. 27, 2007

(65) Prior Publication Data

US 2008/0131791 A1 Jun. 5, 2008

(30) Foreign Application Priority Data

Dec. 1, 2006 (KR) .................. 10-2006-0120974

(51) Int. Cl.
*G03F 1/00* (2006.01)

(52) U.S. Cl. .................. 264/220; 425/385; 425/193; 425/412; 249/114.1; 264/131; 264/293

(58) Field of Classification Search ................ 264/220, 264/131, 293; 425/412, 193, 385, 131; 249/114.1
See application file for complete search history.

(56) References Cited

U.S. PATENT DOCUMENTS

| 5,266,511 | A | * | 11/1993 | Takao | 438/401 |
| 6,210,858 | B1 | * | 4/2001 | Yasuda et al. | 430/270.1 |
| 7,057,832 | B2 | * | 6/2006 | Wu et al. | 359/811 |
| 2001/0007682 | A1 | * | 7/2001 | Chiu et al. | 425/127 |
| 2002/0133129 | A1 | * | 9/2002 | Arias et al. | 604/272 |
| 2003/0127007 | A1 | * | 7/2003 | Sakurai et al. | 101/483 |
| 2004/0135293 | A1 | * | 7/2004 | Umeki | 264/494 |
| 2006/0139561 | A1 | * | 6/2006 | Hofmann et al. | 349/155 |
| 2006/0275018 | A1 | * | 12/2006 | Chae | 385/147 |

* cited by examiner

*Primary Examiner*—Khanh Nguyen
*Assistant Examiner*—Margaret Squalls
(74) *Attorney, Agent, or Firm*—Sughrue Mion, PLLC

(57) ABSTRACT

A pattern template includes a flexible substrate, a template mold formed on the flexible substrate to include a pattern, and an alignment mark, the alignment mark has a greater refractive index than that of the template mold. The template is manufactured by providing a master template including a pattern area, coating resin for mold in the pattern area, forming a template mold by installing a flexible plate on the resin for mold and curing the resin for mold by radiating UV rays, separating the template mold and the master template, coating a metal thin film on the template mold, and forming an alignment mark at both sides of the template mold.

19 Claims, 6 Drawing Sheets

SOFT TEMPLATE WITH ALIGNMENT MARK

CROSS-REFERENCE TO RELATED PATENT APPLICATIONS

This application claims the benefit of Korean Patent Application No. 10-2006-0120974, filed on Dec. 1, 2006, in the Korean Intellectual Property Office, the disclosure of which is incorporated herein in its entirety by reference.

BACKGROUND OF THE INVENTION

1. Field of the Invention

The present invention relates to a soft template with an alignment mark and a manufacturing method thereof, and more particularly, to a soft template having alignment marks formed at both sides of a pattern to facilitate forming a fine pattern in a large area, and a manufacturing method thereof.

2. Description of the Related Art

Photolithography is one of the core parts of semiconductor pattern transfer technology. Electron-beam lithography and X-ray exposure are used in manufacturing a photolithography mask and forming a fine pattern. As the semiconductor patterns become finer, the costs associated with the fabricating semiconductor patterns increase.

Nano-imprint lithography (NIL) has been highlighted as an efficient and economic process for forming patterns. NIL has been suggested to embody a nano process (1-100 nm) by transferring a pattern directly from a mold (template pattern) to a substrate by pressing the mold. Thermoplastic resin or photosensitive resin is coated on a substrate, and a nano-sized mold is pressed onto the substrate to transfer a pattern from the mold to the substrate, following by curing using an E-beam. NIL makes it possible to form a complicated step pattern on a substrate in a simpler way than the conventional photolithography. Conventional photolithography requires several processes to form a multi-step pattern, but NIL allows the formation of such multi-step pattern via an one-time press transfer. Thus, NIL is effective, especially for the formation of a multi-step shape pattern. It was reported that NIL could be used to manufacture electronic and optical devices such as MOS-FETs, in replacement of the conventional lithography. However, although NIL may produce a fine structure of a nanometer-scale, it cannot attain the positional accuracy of the alignment, which is provided by photolithography.

The NIL may be divided into two types: hot embossing or thermal imprint lithography, and UV-assisted imprint lithography. In the hot embossing or thermal imprint lithography, heat is applied to a polymer layer to make it flexible, followed by pressing the polymer layer against a mold to form a desired pattern on the polymer layer. However, the application of high heat and pressure requires an expensive, complicated apparatus. Also, there are disadvantages, for example, it is difficult to apply the hot embossing or thermal imprint lithography to form large scale patterns, as it requires a high pressure, and cracks can be formed in the substrate.

To solve these problems, UV-assisted imprint lithography, which uses a polymer cured by UV rays, has been introduced. This method is similar to the conventional hot embossing method, except the former uses a liquid having a viscosity similar to that of water, which is cured by UV rays, and thus pressing may be performed at much lower pressure than the hot embossing. Since UV rays are used to cure a polymer layer, a quartz based mold is used. This method is advantageous in comparison with the conventional imprint method in terms of the process conditions such as lower pressure. However, it is very difficult and expensive to form a nano-pattern on a quartz mold. Also, it is difficult to prevent bubbles, which cause defects, from being trapped in the mold. Presently, these two imprint methods are used in various fields.

Various factors attribute to the advantages or disadvantages of the NIL process. They include, for example 1) enabling a large area process, 2) minimizing a polymer residual layer, and 3) securing a precise alignment. Also, the separation of the mold from the polymer layer and lowering the pressure and temperature are important factors.

As to the factor of the large area process, it has been reported that about a 4" wafer process could be successfully performed, almost without defects. For a larger size substrate, there is currently no report of successful overall pattern transfer of a wafer by one-time process, probably because applying a uniform pressure over a large area is difficult, and the price of the mold itself is high. Thus, a "step and repeat method," in which a small mold is repeatedly printed, has recently been widely used. In theory, the step and repeat process can be applied to an 8" or larger wafer.

The residual layer-related concerns are unequivocally applicable to molding processes, including imprint processes. When the polymer is pressed by a mold, a polymer residual layer having a certain thickness always remains on the substrate. Thus, two-step dry etching including a polymer etching process is needed to remove the polymer residual layer. Much research is directed towards reducing the polymer residual layer.

A method using a soft template instead of a rigid template has been suggested to enable a large area process and minimize the polymer residual layer. FIG. 1A illustrates a conventional nano-imprint process using a rigid template, and FIG. 1B illustrates a conventional nano-imprint process using a soft template.

Referring to FIG. 1A, a resin layer 12 is formed on a substrate 11 having an undulated or wavy surface. A pattern 12a is transferred to the resin layer 12 by applying pressure using a rigid template 103. When the rigid template 103 such as quartz is used, an irregular pattern may be obtained and a polymer residual layer may be left, limiting the use of the process for the formation of a large area pattern.

Referring to FIG. 1B, a soft template 13 can transfer a pattern for the resin layer 12 onto the undulated substrate 11, so that a uniform pattern 12b can be obtained and the polymer residual layer can be minimized. The soft template 13 can be manufactured through a UV nano-imprint process, at a low cost, from a master template formed of quartz or Si.

The alignment-related concerns are relatively less frequently faced in an exposure process where a master pattern and a substrate are not in contact to each other. The exposure process can be easily applied to a curved or multilayered structure. However, when the nano-imprint process is applied to a curved or multilayer structure, the chances of failing to transfer a pattern increases. Many studies to solve this problem using an alignment mark are underway. For the soft template, no solutions applicable to the nano-imprint process have been suggested.

The conventional nano-imprint process uses a method of forming an alignment mark on the surface of a template by etching. However, when the template is used, it is difficult to identify the alignment mark when the patterning resin is bring into contact with the template during the imprint process, because the template and patterning resin usually have similar refractive indexes. To solve this problem, as shown in FIGS. 2A through 2E, a method of forming an alignment mark in a lower portion of a pattern of a template has been suggested.

Referring to FIG. 2A, resist patterns 22 are formed on a glass or $SiO_2$ substrate 21. As shown in FIG. 2B, reactive ion etching (RIE) is performed to the substrate 21 in a pattern area 23 between the resists patterns 22. Referring to FIGS. 2C and 2D, an alignment mark 24 and $SiO_2$ are deposited, and then RIE is performed again. Referring to FIG. 2E, the resist 22 is removed in a lift-off process to obtain an alignment mark embedded template. It can be seen that the alignment mark 24 is formed in the lower portion of each pattern area 23. However, for the template shown in FIG. 2E, it is almost impossible to identify the nano-sized alignment mark 24 that is formed in the lower portion of the pattern 23. To identify alignment mark, the alignment mark needs to have a size in micrometers. Thus, it is difficult to be used for a nano-sized imprint process.

SUMMARY OF THE INVENTION

The present invention provides a soft template which can be used for a large area process during a nano-imprint process. The soft template minimizes the formation of a polymer residual layer, and includes an alignment mark that can be easily identified so as to be used for a process in which an alignment is performed. The soft template can be easily separated after imprint process. The present invention also provides a method for manufacturing the soft template.

According to an aspect of the present invention, there is provided a pattern template comprising a flexible substrate; a template mold formed on the flexible substrate, the mold having a pattern formed thereon; and an alignment mark formed on the template mold, the alignment mark having a refractive index which is greater than that of the template mold.

The template further comprises a metal film interposed between the template mold and the alignment mark.

The template further comprises a SAM coating layer formed on the metal thin film.

Two or more the alignment marks are provided on the template mold, each at opposite ends of a surface of the template.

The flexible substrate is a light transmitting substrate.

The flexible substrate is formed of a poly(ethylene terephthalate)(PET), polyurethane elastomer, or soft epoxy resin.

The metal thin film is formed of Au, Ag, Cu, Pd, or Pt.

The alignment mark comprises a benzene radical.

According to another aspect of the present invention, there is provided a method of manufacturing a pattern template with an alignment mark comprises providing a master template including a patterned area and a resin layer applied on the pattern area, placing a flexible plate on the coating resin and curing the resin to form a template mold; separating the template mold from the master template; and forming an alignment mark on the template mold, the alignment mark having a refractive index which is greater than that of the template mold. The method further comprises applying a metal film on the template mold before forming the alignment mark.

The method further comprises forming a SAM layer by coating a ligand or precursor selected according to the material of the metal thin film on the template mold and the metal thin film.

The master template is formed of quartz, Si, or Ni.

The resin for mold comprises a photo initiator that enables a UV reaction with a functionalized prepolymer. The prepolymer includes an acrylate group.

The master template is formed by coating an E-beam reactive polymer on a wafer, performing a patterning and developing process by E-beam lithography, and performing a dry etching process.

Two or more alignment marks are formed on the metal film. The alignment marks are each formed at opposite ends of the metal film. The alignment marks are formed by coating a material, which has a greater refractive index than that of the template mold, using a CVD (chemical vapor deposition) or dispensing method.

The alignment mark comprises a benzene radical.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1A:
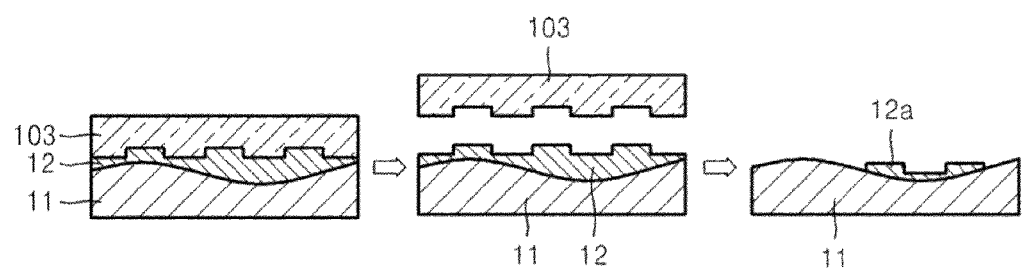
FIG. 1A illustrates a conventional nano-imprint process using a rigid template.
Figure 1B:
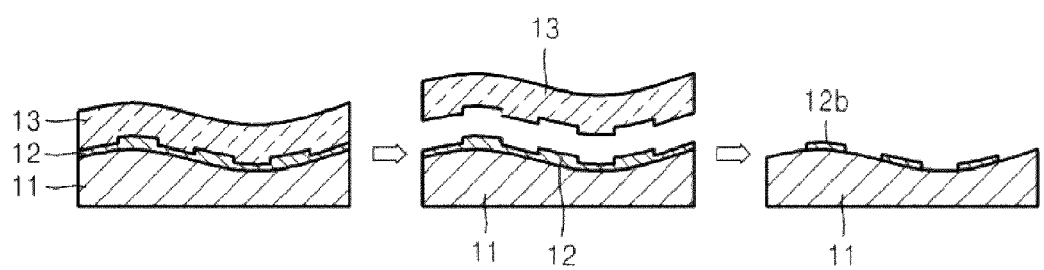
FIG. 1B illustrates a conventional nano-imprint process using a soft template.
Figure 2A:
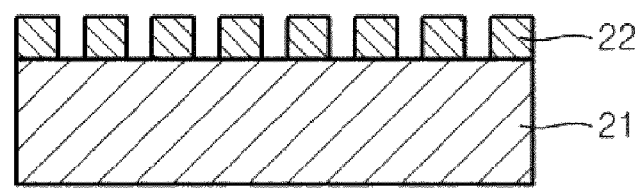
FIGS. 2A through 2E illustrate the steps of the conventional method of manufacturing a template with an alignment mark.
Figure 2B:
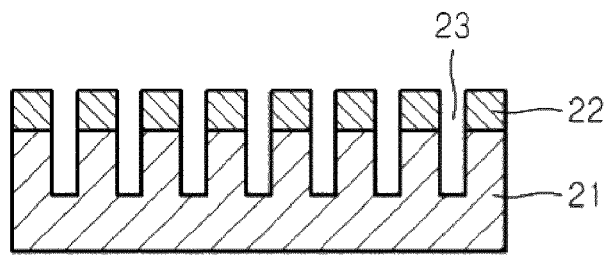
Figure 2C:
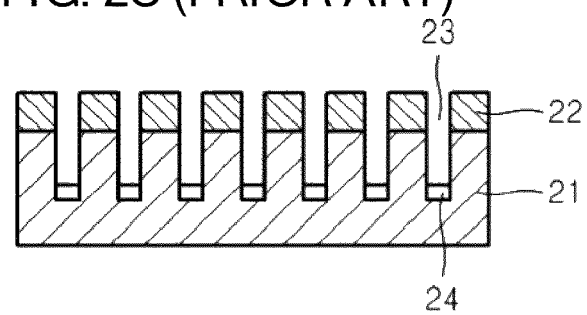
Figure 2D:
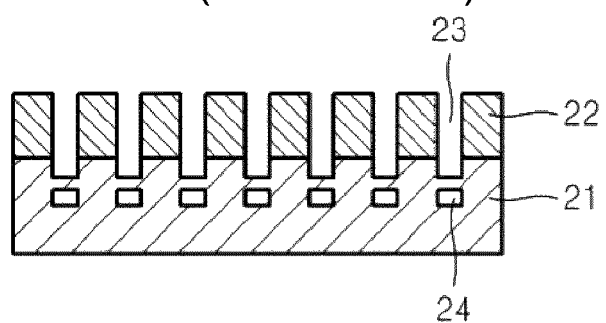
Figure 2E:
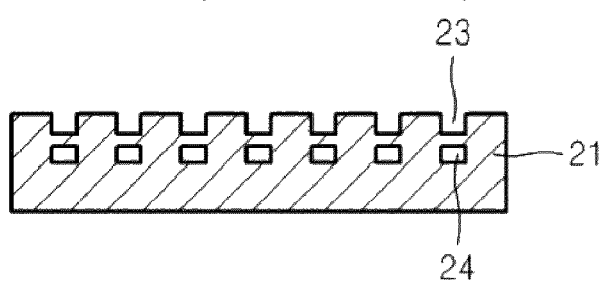

A template with an alignment mark according to the present invention and a manufacturing method thereof will now be described more fully with reference to the accompanying drawings. In the drawings, the thicknesses of layers and regions are exaggerated for clarity.

Figure 3:
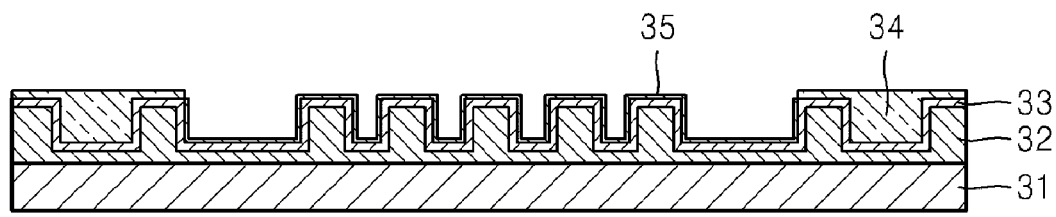
FIG. 3 illustrates a soft template with an alignment mark according to an exemplary embodiment of the present invention.

Referring to FIG. 3, a template mold 32 including a pattern is formed on a flexible substrate 31. A thin metal film 33 is formed on the template mold 32. Alignment marks 34 are each formed on a patterned area at opposite ends of the template mold 32. A self-assembled monolayer (SAM) coating layer 35 is formed on the metal thin film 33. The template according to the present embodiment keeps advantages of a soft template by using the flexible substrate 31, and gives better alignment during an imprint process by including the alignment mark 34 having a higher refractive index than the template mold 32.

Figure 4A:
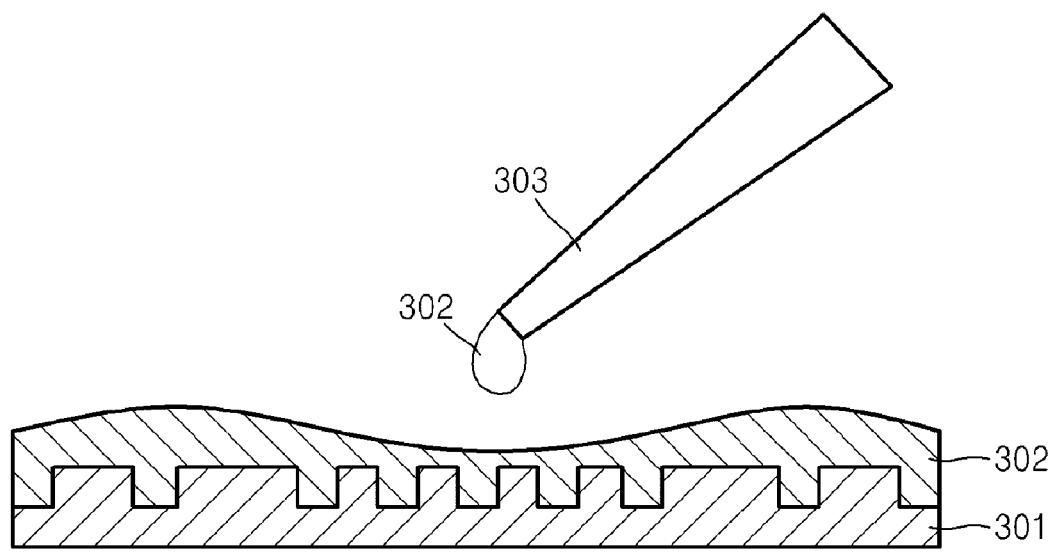
FIGS. 4A through 4F illustrate the steps of a method of manufacturing a template with an alignment mark according to an exemplary embodiment of the present invention.

FIGS. 4A through 4F illustrate the steps of a method of manufacturing a template with an alignment mark according to an embodiment of the present invention. Referring to FIG. 4A, a master template 301 having a desired pattern is provided to manufacture a template with an alignment mark according to an embodiment of the present invention. The master template 301 may be formed of transparent quartz, Si, or Ni. In the step of forming the master template 301, first, E-beam reactive polymer is coated on a quartz wafer having a thin coating of Cr. The master template 301 is patterned by E-beam lithography, developed, and dry etched to produce a surface having a nano-pattern.

It is preferable to perform the SAM coating on the master template 301 for the separation of a pattern area in the step of forming a template with an alignment mark according to the present embodiment using the master template 301. The SAM coating can be performed by various methods such as dipping method, a spin coating method or a vapor processing method.

First, in a dipping or immersing method, the substrate is immersed for about 12 hours in a solution containing a ligand or a precursor that can react with the substrate. Second, in a spin coating method, a solution containing a ligand or a precursor is spin coated onto the substrate. Third, in a vapor processing method, the substrate is exposed to a reactive vapor in a vacuum state.

Of these methods, the vapor processing method may be used advantageously in the present embodiment, because when a nano pattern is to be formed, there is a possibility of distorting the pattern during the SAM coating. Various materials can be used as the ligand or precursor for the SAM coating, according to the type of substrate.

When a quartz is used, $RSiCl_3$ or $RSi(OR')_3$ can be used as the ligand. An anchoring group forming a chemical combination with the substrate is $—SiCl_3$ or $—Si(OR')_3$. As head group R—, a fluorine compound which exhibits good oil and water repellency may be used. For example, tridecafluoro-1,1,2,2-tetrahydrooctyl)-trichlorosilane[$CF_3—(CF_2)_5—CH_2—CH_2—SiCl_3$](FOTCS) (Gelest, Inc.) can be used, dissolved in a solvent of anhydrous n-heptane($C_7H_6$) to the concentration of 1 ppm solution. n-Heptane is a medium that helps a vaporized SAM ligand to be absorbed by the substrate and FOTCS is sensitive to moisture. That is, when FOTCS contacts moisture, a chemical reaction occurs, causing clouding and congealing. When a SAM contaminated by moisture is used to form a coat on the pattern of the substrate or moisture is introduced during the formation of the SAM coat, the SAM coat completely covers the pattern surface of the substrate, causing the deformation of the pattern.

Before the formation of the SAM coat, the surface of the substrate is cleaned and many silanol (Is-OH) groups are formed. For this purpose, $O_2$ plasma ashing is performed for 5 to 10 seconds, forming —OH radicals distributed over the surface of a substrate (e.g., quartz substrate), in order to render the surface of the substrate hydrophilic. When the above-described solution is put in a vacuum chamber, the SAM ligand (particularly, the anchoring group Cl or OR') in a vapor form reacts with the surface of the substrate where the silanol groups are formed. For example, Cl of the ligand reacts with H of the substrate to form HCl, which is released, and a chemical reaction between the ligand and the O group of the substrate, resulting in the formation of the SAM coat on the master template 301.

Mold resin 302 is coated on the master template 301 that is SAM coated. The mold resin 302 may be applied, for example, using a dispenser 303. When the mold resin 302 is coated, air may be trapped in the pattern area between the master template 301 and the mold resin 302. To prevent the trapped air, a step of removing the air under a vacuum may be further included after coating the mold resin 302.

The mold resin 302 includes a photo initiator to enable a UV reaction with a functionalized prepolymer including an acrylate group. Also, the mold resin 302 can include a release agent to aid mold release from the master template 301. The mold resin 302 has characteristics of mechanical rigidity, flexibility, low shrinkage, and good light transmittance.

Figure 4B:
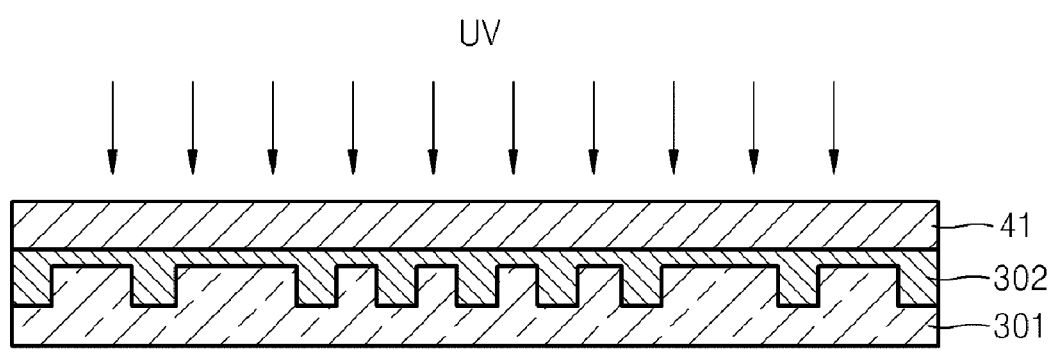

Referring to FIG. 4B, a plate 41 is placed on the mold resin 302, and the mold resin 302 is cured by UV rays. The plate 41 is flexible and may transmit the UV rays. The plate 41 can be formed of a poly(ethylene terephthalate)(PET), polyurethane elastomer, or soft epoxy resin.

Figure 4C:
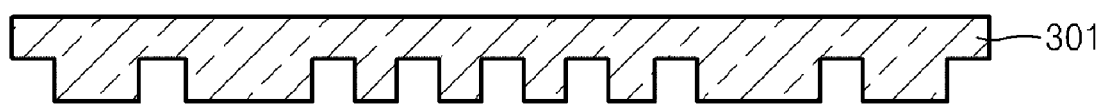

Referring to FIG. 4C, the mold resin 302 is cured by the UV rays and becomes the template mold 32 including a pattern. The master template 301 is separated from the template mold 32. Since the surface of the master template 301 is SAM coated, the master template 301 can be easily separated from the template mold 32. Since the plate 41 is flexible, there is no deformation in the pattern. After the master template 301 is separated, the template mold 32 is subject to a post-treatment using UV light to lower the critical surface energy may be performed, to aid separation from an imprint resin later.

A pair of the pattern to form an alignment mark is formed at opposite ends of the template mold 32. The post-treatment is performed to enable the identification of the alignment mark without being affected by the imprint resin during the nano-imprint process.

Figure 4D:
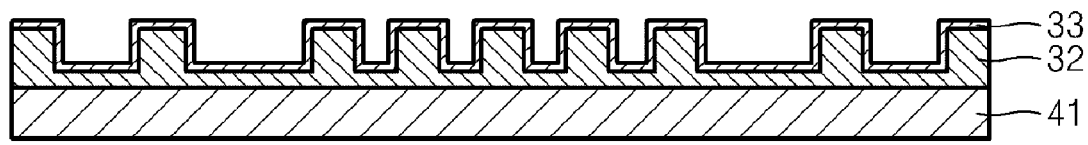

Referring to FIG. 4D, the thin metal film 33 is deposited by sputtering onto the template mold 32. The metal film 33 may be formed of Au, Ag, Cu, Pd, or Pt.

Figure 4E:
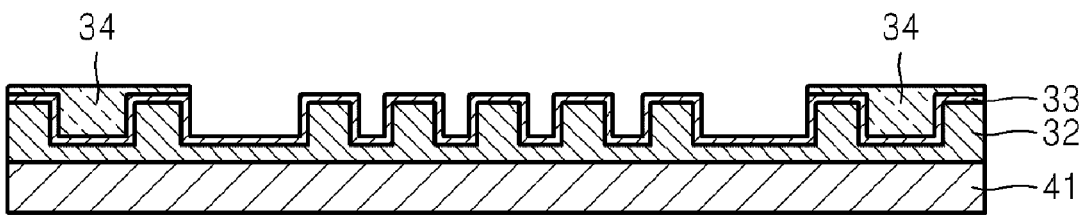

Next, referring to FIG. 4E, the alignment mark 34 is formed by coating a high refractive material on an alignment mark area at opposite ends of the template mold 32, using a chemical vapor deposition (CVD) or dispensing method, which are known in the art. When the dispensing method is used, the material dispensed may include a large amount of benzene radicals to increase its refractive index. Also, to enable the curing by UV rays, a UV curing pre-polymer and photo initiator may be used. Template mold 32 has a refractive index similar to that of the resin which will be used later for the nano-imprint process. The alignment mark 34, which is formed on the template mold 32 is formed of a material which has a higher refractive index than the template mold 32 or the resin used for the nano-imprint process, so that the alignment mark may be easily identified, distinguished from the template mold 32 or the resin. Multiple alignment marks may be formed. For example, two alignment marks may be formed on the template mold 32, each on the opposite end of the surface of the template mold 32, as shown in FIG. 4E. However, it should be noted that the alignment marks 34 may be formed on various areas as long as they do not interfere with the pattern of the template mold 32.

Figure 4F:
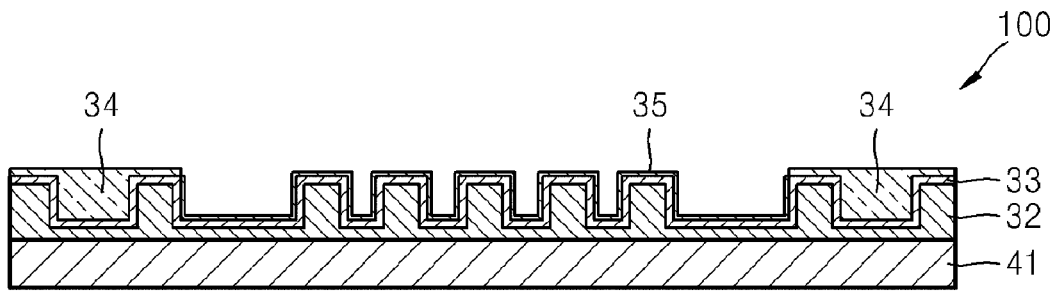

Referring to FIG. 4F, the SAM coating layer 35 is formed on the thin metal film 33 to produce an imprint template 100 with a desired pattern. When a nano pattern is formed on the template mold 32, a contact area with imprint resin during the subsequent imprint process increases, and, thus, an incomplete separation of the imprint resin from the mold 32 may become a problem. To avoid the problem, the template mold 32 may be coated with a SAM. Since the metal film 33 is already formed on the surface of the template mold 32, the SAM coating can be easily performed by a typical method on the metal film 33. An appropriate SAM ligand may be selected depending on the material of the metal film 33. Table 1 shows SAM ligands according to the material of the metal film 33 and the structure of combinations formed on the surface of the metal film 33 after the SAM coating process.

TABLE 1

| Substrate (thin metal film) | Ligand or Precursor | Combination Type |
|---|---|---|
| Au | RSH, ArSH(thiols) | RS—Au |
| Au | RSSR'(disulfides) | RS—Au |
| Au | RSR'(sulfides) | RS—Au |
| Au | RSO2H | RSO2-Au |
| Au | R3P | R3P—Au |
| Ag | RSH ArSH | RS—Ag |
| Cu | RSH ArSH | RS—Cu |
| Pd | RSH ArSH | RS—Pd |
| Pt | RNC | RS—Pt |

For example, when the metal film 33 is formed of Au, $X(CH_2)_nSH$ can be used as the SAM ligand. When the SAM coating is performed on the metal film 33, Au reacts with alkanethiolate $CH_3(CH_2)nS—$. The head group X may be a fluorine compound. Thus, oil and water repellency can be improved. Also, by reducing the surface energy of the template mold 32, it can be easily separated from the imprint resin after subsequent imprint process.

Figure 5A:
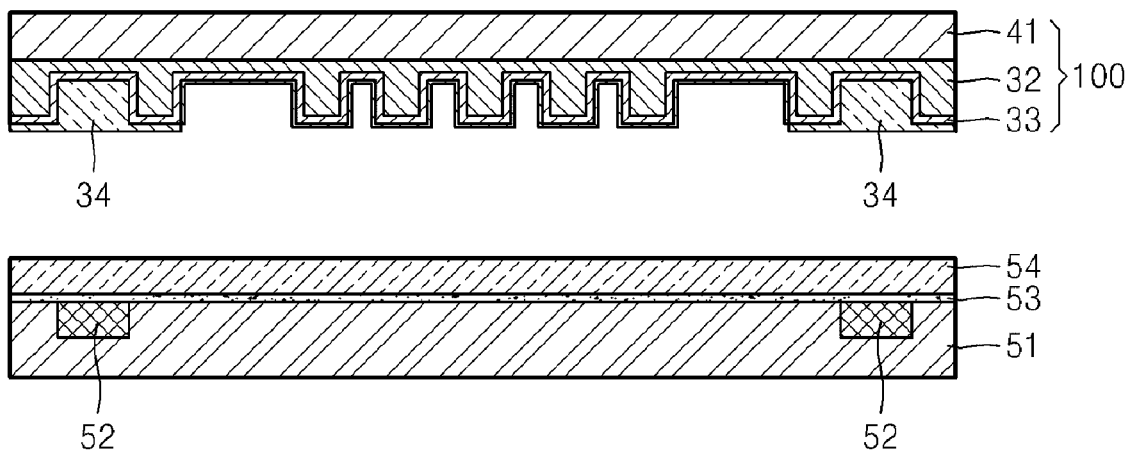
FIGS. 5A through 5C illustrate a nano-imprint process using the soft template of FIG. 3.
Figure 5B:
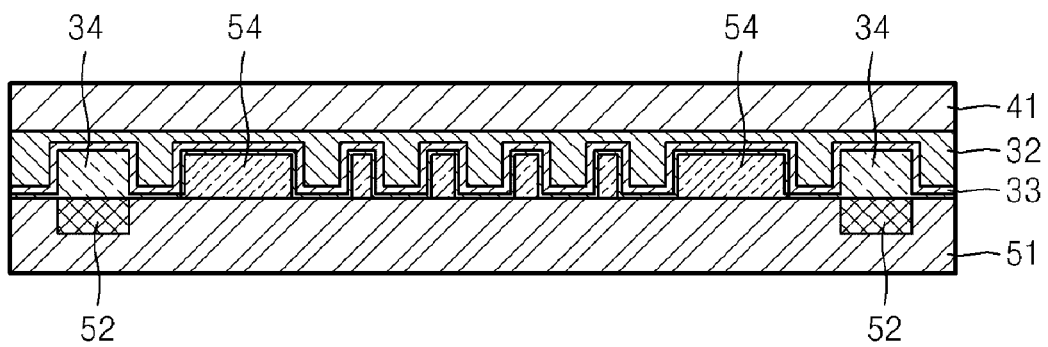
Figure 5C:
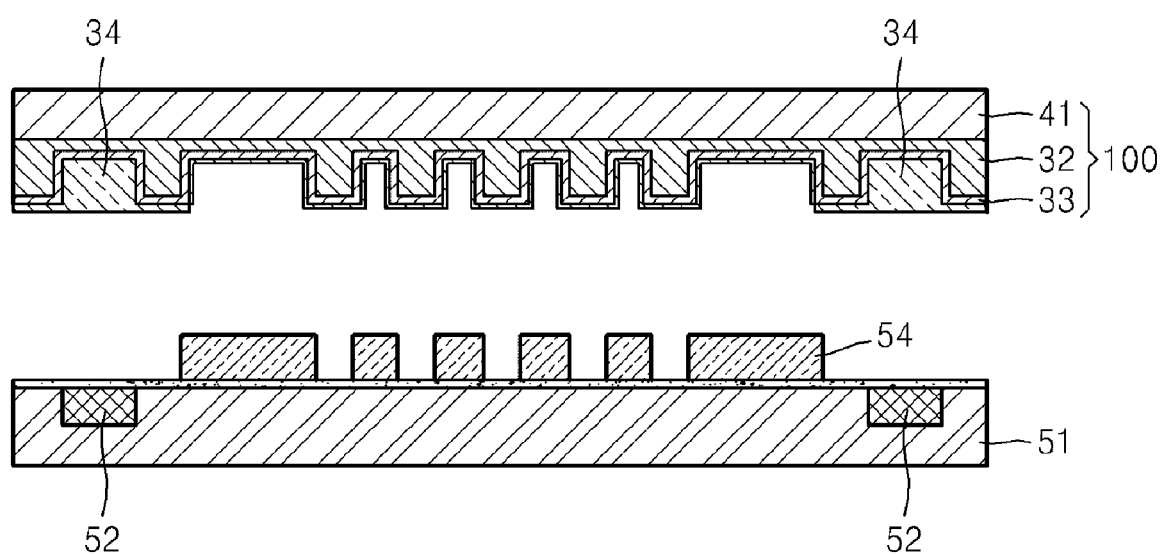

FIGS. 5A through 5C illustrate a nano-imprint process (UV-NIL) using the soft template of FIG. 3. Referring to FIG. 5A, two alignment marks 52 are formed on a substrate 51. A fixing layer 53 is formed on the substrate 51 and the alignment mark 52. A patterning resin 54 is coated on the fixing layer 53 by spin coating. The patterning resin 54 used for the nano-imprint process is UV cured and has a viscosity of about 5 CPs or less. Also, in an embodiment of the present invention, it is preferable that the patterning resin 54 is not easily vaporized during the spin coating process performed on the surface of the substrate 51. Further, the patterning resin 54 preferably maintains mechanical strength after the UV radiation curing and can be processed at a low temperature (e.g., room temperature) and a low pressure. In addition, in an embodiment of the present invention, the patterning resin 54 is preferably not easily etched. Considering the above conditions, the patterning resin may include an active ingredient, a release agent, a viscosity modifier, and a photo initiator. The active ingredient is a monomer. The release agent is an ingredient added to aid separation of the resin 54 from the template after the patterning resin 54 is cured. The release agent is of a high viscosity. Thus, the content of release agent is controlled in such a way to adjust (e.g., reduce) its wetting or filling characteristics in a patterned area. To adjust the viscosity of the release agent in the resin, a viscosity modifier may be used. However, since the viscosity modifier may deteriorate mechanical strength of the patterning resin 54, the content of the viscosity modifier needs to be appropriately controlled. The photo initiator forms a radical ion under UV radiation and initiates a chain formation, i.e., the formation of a polymer from the monomer (i.e., active ingredient).

A surfactant can be added to prevent the deterioration of the wetting characteristics of the patterning resin 54 on the substrate 51 during the spin coating process. The surfactant is an organic compound having both of a hydrophilic group and a hydrophobic group, and can be used for both organic solvent and water. The surfactant reduces surface tension at a fluid boundary to improve wetting characteristics. When the surface of the substrate 51 is treated with hexamethyldisilazane (HMDS), the adhesion of the patterning resin 54 to the substrate 51 may be further improved, resulting in the improved coating stability.

Referring to FIG. 5B, the template 100 with alignment marks 33 according to the present embodiment is placed on the patterning resin 54. The template contacts the patterning resin 54 and pressure is applied. The position of the substrate 51 may be adjusted using an optical microscope such that the relative error distance between the alignment mark 53 of the substrate 51 and the alignment marks 34 of the template can be minimized. After aligning the substrate 51 and the template 100, a residual resin is removed and pressure is increased to minimize the amount of the polymer residual layer. The patterning resin 54 is cured by radiating UV rays through the plate 41 of the template.

Referring to FIG. 5C, the template 100 is separated from the cured patterning resin 54, and then the polymer residual layer is completely removed by $O_2$ ashing. As a result, the pattern of the template 100 can be transferred to the substrate 51.

While this invention has been particularly shown and described with reference to preferred embodiments thereof, it will be understood by those skilled in the art that various changes in form and detail may be made therein without departing from the spirit and scope of the invention as defined by the appended claims.

As described above, the present invention has the following advantages.

First, by forming the alignment mark at both sides of the template mold, when the template mold contacts the patterning resin during the imprint process, the alignment mark can be easily identified so that the alignment between the template and the substrate for imprint is easy.

Second, the SAM coating film formed by the ligand appropriately selected according to the metal thin film formed on the surface of the template aids separation from the patterning resin during the imprint process. Thus, the life span of the template can be extended.

Third, the soft template facilitates the formation of the nano-sized pattern during the imprint process. Also, there is no distortion of the pattern during separation, and a large area imprint process is possible.

Fourth, the soft template can be easily manufactured from the master template, which is very economical.

What is claimed is:

1. A pattern template comprising:
   a flexible substrate;
   a template mold formed on the flexible substrate, the mold having a pattern formed thereon;
   a metal film formed on the template mold; and
   an alignment mark formed on the metal film, the alignment mark having a refractive index which is greater than that of the template mold,
   wherein the template mold has a pattern for the alignment mark; and
   wherein the template mold, the metal film, and the alignment mark are layered on the flexible substrate in the order of, from the bottom of the layer which is in contact with the flexible substrate to the top of the layer, the template mold, the metal film, and the alignment mark.

2. The template of claim 1, further comprising a self assembly monolayer (SAM) coating formed on the alignment mark and the metal film.

3. The template of claim 1, wherein two or more of the alignment marks are provided on the metal film, each at opposite ends of one surface of the metal film.

4. The template of claim 1, wherein the flexible substrate transmits light.

5. The template of claim 1, wherein the flexible substrate is formed of a poly(ethylene terephthalate)(PET), polyurethane elastomer, or soft epoxy resin.

6. The template of claim 1, wherein the metal film is formed of a material selected from the group consisting of Au, Ag, Cu, Pd, and Pt.

7. The template of claim 1, wherein the alignment mark comprises a benzene radical.

8. A method of manufacturing a pattern template with an alignment mark according to claim 1, the method comprising:
   providing a master template including a patterned area and a coating resin applied on the patterned area;
   placing a flexible plate on the coating resin and curing the resin to form a template mold;
   separating the template mold from the master template; and
   forming an alignment mark on the template mold, the alignment mark having a refractive index which is greater than that of the template mold.

9. The method of claim 8, which further comprising applying a metal film on the template mold before forming the alignment mark.

10. The method of claim 8, further comprising forming a self assembly monolayer (SAM) by applying a ligand or precursor on the template mold.

11. The method of claim 9, further comprising forming a self assembly monolayer (SAM) by applying a ligand or precursor on the metal film.

12. The method of claim 8, wherein the master template is formed of quartz, Si, or Ni.

13. The method of claim 8, wherein the resin comprises a photo initiator that enables a UV reaction with a functionalized prepolymer.

14. The method of claim 13, wherein the prepolymer contains an acrylate group.

15. The method of claim 8, wherein the master template is formed by coating an E-beam reactive polymer on a wafer, performing a patterning and developing process by E-beam lithography, and performing a dry etching process.

16. The method of claim 9, wherein two or more alignment marks are formed on the metal film.

17. The method of claim 16, wherein the two or more alignment marks are each formed at opposite ends of the metal film.

18. The method of claim 16, wherein the alignment marks are formed by coating a material, which has a greater refractive index than that of the template mold, using a chemical vapor deposition or dispensing method.

19. The method of claim 18, wherein the alignment marks comprise a benzene radical.

* * * * *